(12) United States Patent
Liu et al.

(10) Patent No.: US 9,978,738 B2
(45) Date of Patent: May 22, 2018

(54) SYSTEM, APPARATUS, AND METHOD FOR N/P TUNING IN A FIN-FET

(71) Applicant: QUALCOMM Incorporated, San Diego, CA (US)

(72) Inventors: Yanxiang Liu, Glenville, NY (US); Haining Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days. days.

(21) Appl. No.: 15/582,770

(22) Filed: May 1, 2017

(65) Prior Publication Data

US 2017/0236815 A1    Aug. 17, 2017

Related U.S. Application Data

(62) Division of application No. 14/668,476, filed on Mar. 25, 2015, now abandoned.

(51) Int. Cl.
| | |
|---|---|
| *H01L 27/02* | (2006.01) |
| *H01L 29/78* | (2006.01) |
| *H01L 27/092* | (2006.01) |
| *H01L 29/66* | (2006.01) |

(52) U.S. Cl.
CPC ...... *H01L 27/0207* (2013.01); *H01L 27/0924* (2013.01); *H01L 29/66545* (2013.01); *H01L 29/7851* (2013.01)

(58) Field of Classification Search
None
See application file for complete search history.

(56) References Cited

U.S. PATENT DOCUMENTS

| | | | |
|---|---|---|---|
| 7,469,396 B2 | 12/2008 | Hayashi et al. | |
| 7,538,368 B2 | 5/2009 | Yano | |
| 7,569,887 B2 | 8/2009 | Otsuki | |
| 8,865,560 B2 | 10/2014 | Mor et al. | |
| 2009/0184379 A1 | 7/2009 | Ota | |
| 2012/0254817 A1* | 10/2012 | Sherlekar | G06F 17/5068 716/119 |
| 2013/0026572 A1 | 1/2013 | Kawa et al. | |
| 2013/0141963 A1 | 6/2013 | Liaw | |
| 2013/0270647 A1 | 10/2013 | Zhu et al. | |
| 2014/0061801 A1 | 3/2014 | Doornbos et al. | |
| 2014/0077303 A1 | 3/2014 | Baek | |
| 2014/0252486 A1 | 9/2014 | Lin, Jr. et al. | |
| 2014/0327081 A1 | 11/2014 | Hsieh et al. | |
| 2015/0076609 A1 | 3/2015 | Xie et al. | |
| 2016/0225767 A1* | 8/2016 | Liu | H01L 27/0207 |
| 2016/0284836 A1 | 9/2016 | Liu et al. | |

FOREIGN PATENT DOCUMENTS

WO    2015025441 A1    2/2015

OTHER PUBLICATIONS

International Search Report and Written Opinion—PCT/US2016/023959—ISA/EPO—Jun. 24, 2016.

\* cited by examiner

*Primary Examiner* — Daniel Whalen
(74) *Attorney, Agent, or Firm* — MG-IP Law, P.C.

(57) ABSTRACT

The n-type to p-type fin-FET strength ratio in an integrated logic circuit may be tuned by the use of cut regions in the active and dummy gate electrodes. In some examples, separate cut regions for the dummy gate electrodes and the active gate electrode may be used to allow for different lengths of gate pass-active regions resulting in appropriately tuned integrated logic circuits.

20 Claims, 5 Drawing Sheets

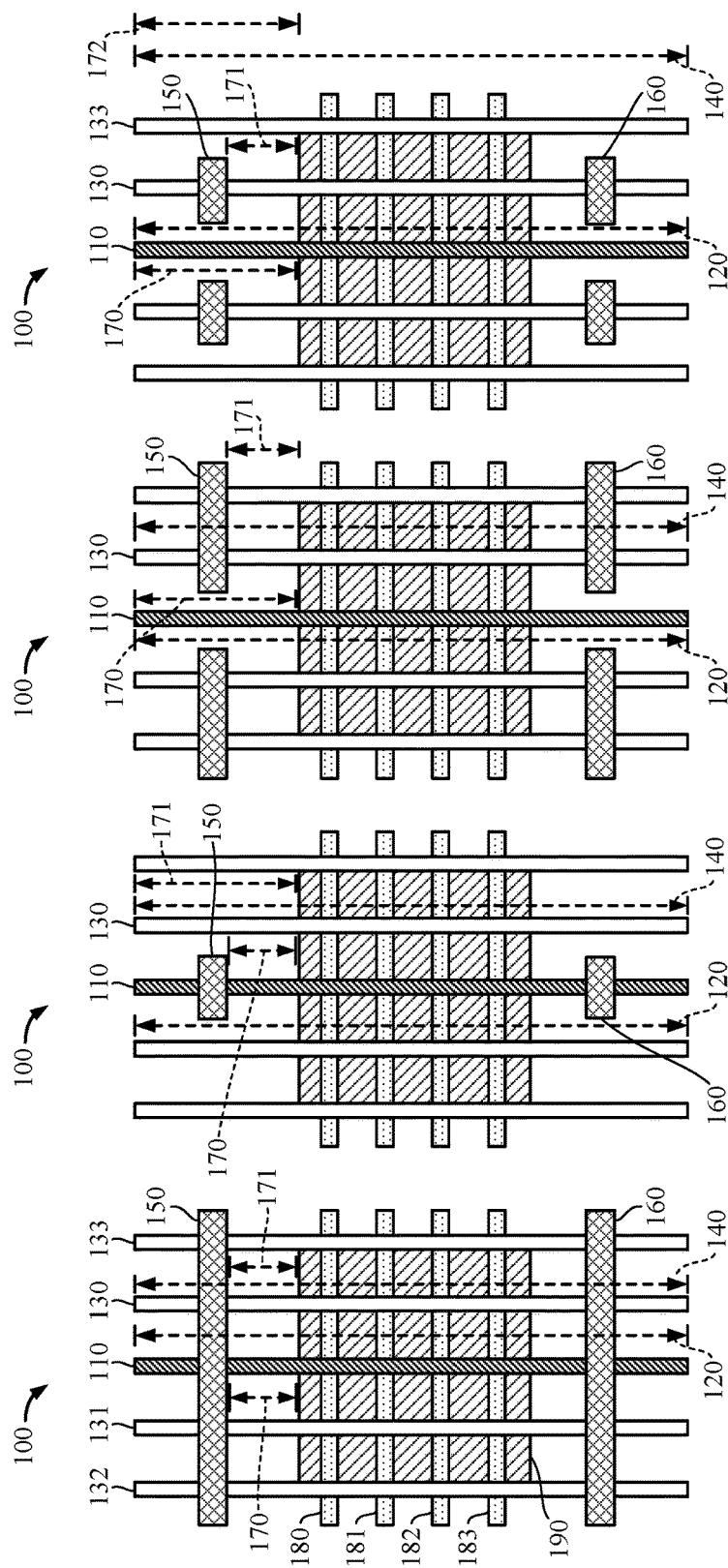

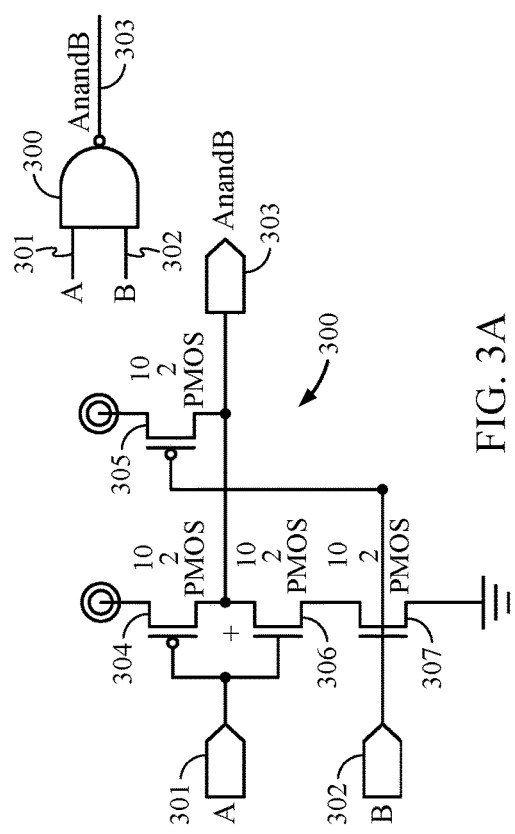
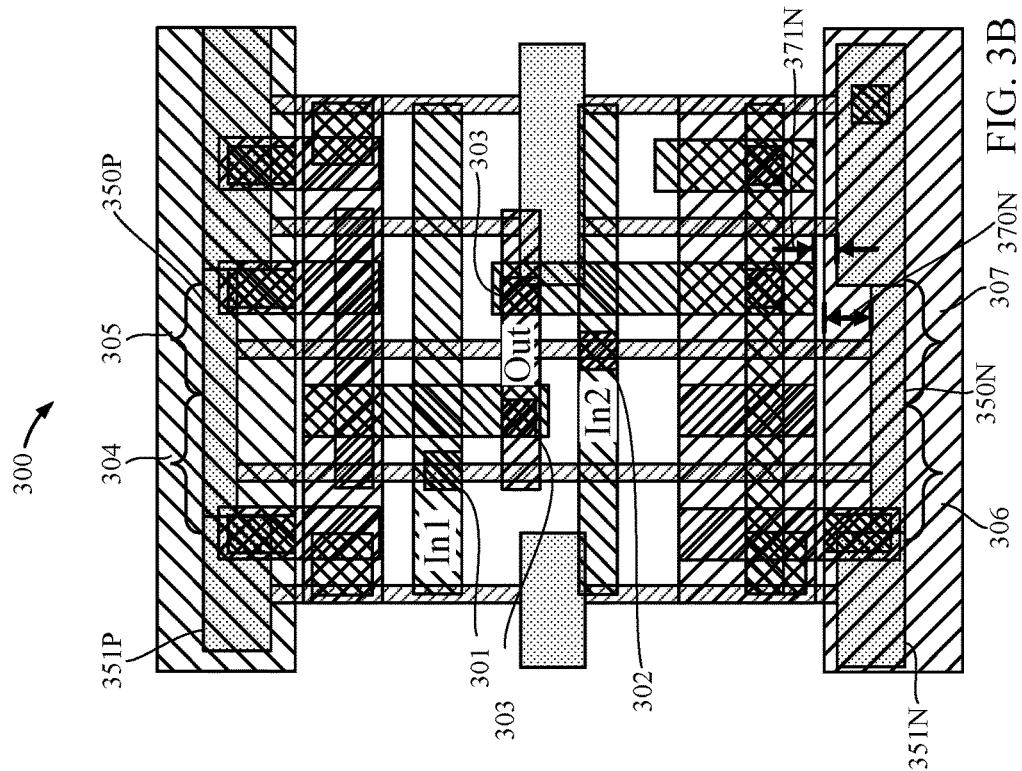
FIG. 3A
FIG. 3B

US 9,978,738 B2

SYSTEM, APPARATUS, AND METHOD FOR N/P TUNING IN A FIN-FET

CLAIM OF PRIORITY UNDER 35 USC § 120

The present Application for Patent is a divisional application of and claims priority to application Ser. No. 14/668,476, entitled "SYSTEM, APPARATUS, AND METHOD FOR N/P TUNING IN A FIN-FET," filed Mar. 25, 2015, and assigned to the assignee hereof and hereby expressly incorporated by reference herein.

FIELD OF DISCLOSURE

This disclosure relates generally to field effect transistors (FET), and more specifically, but not exclusively, fin-FET devices.

BACKGROUND

With the increasing down-scaling of integrated circuits and increasingly demanding requirements to the speed of integrated circuits, transistors need to have higher drive currents with smaller dimensions. Fin field-effect transistors (fin-FET) were thus developed. Fin-FET transistors have increased channel widths. Since the drive currents of transistors are proportional to the channel widths, the drive currents of fin-FETs are increased. To maximize the channel width of a fin-FET, the fin-FET may include multiple fins, with the ends of the fins connected to a same source and a same drain. The formation of multi-fin fin-FET may include forming a plurality of fins parallel to each other, forming a gate stack on the plurality of fins, and interconnecting the ends of the plurality of fins to form a source region and a drain region. The forming of the gate stack may include depositing layers of material on the fins and patterning the deposited layers to form the gate stack. Several multi-fin fin-FETs may be formed next to each other on a substrate which may include a dummy gate stack between fin-FETs to aid in certain processing steps.

However, due to the integral fin numbers, the fin-FET N/P strength ratio (ratio of N-type fin-FETs to P-type fin-FETS) is difficult to tune. Additionally, designers typically demand varied N/P ratios for different circuits. In conventionally FETs, the FET width would be used to tune the N/P strength ratio. By varying the width of the FET portion, the strength ratio can be tuned to the desired strength ratio.

Accordingly, there is a need for systems, apparatus, and methods that improve upon conventional approaches including the improved methods, systems and apparatus provided hereby.

The inventive features that are characteristic of the teachings, together with further features and advantages, are better understood from the detailed description and the accompanying figures. Each of the figures is provided for the purpose of illustration and description only, and does not limit the present teachings.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

Some examples of the disclosure are directed to systems, apparatus, and methods for a fin-FET including: an active gate electrode extending vertically a first distance; a first dummy gate electrode extending vertically a second distance, the first dummy gate electrode being in parallel with the active gate electrode; a first cut region extending horizontally across the active gate electrode; a second cut region spaced vertically from the first cut region and extending horizontally across the active gate electrode; an active region between the first cut region and the second cut region; a dummy gate pass-active region between an end of the first dummy gate electrode and the active region along the first dummy gate electrode; and an active gate pass-active region between the first cut region and the active region along the active gate electrode.

Some examples of the disclosure are directed to systems, apparatus, and methods for a fin-FET including: an active gate electrode extending vertically a first distance; a first dummy gate electrode extending vertically a second distance, the first dummy gate electrode being in parallel with the active gate electrode; a first cut region extending horizontally across the first dummy gate electrode; a second cut region spaced vertically from the first cut region and extending horizontally across; an active region between the first cut region and the second cut region; a dummy gate pass-active region between the first cut region and the active region along the first dummy gate electrode; and an active gate pass-active region between an end of the active gate electrode and the active region along the active gate electrode.

Some examples of the disclosure are directed to systems, apparatus, and methods for a fin-FET including: an active gate electrode extending vertically a first distance; a first dummy gate electrode extending vertically a second distance, the first dummy gate electrode being in parallel with the active gate electrode; a second dummy gate electrode extending in parallel with the first dummy gate electrode and spaced horizontally therefrom; a first cut region extending horizontally across the first dummy gate electrode; a second cut region spaced vertically from the first cut region and extending horizontally across the first dummy gate electrode; an active region between the first cut region and the second cut region; a dummy gate pass-active region between the first cut region and the active region along the first dummy gate electrode; a second dummy gate pass-active region between an end of the second dummy gate electrode and the active region along the second dummy gate electrode; and an active gate pass-active region between an end of the active gate electrode and the active region along the active gate electrode.

Some examples of the disclosure are directed to systems, apparatus, and methods for a fin-FET including: an active gate electrode extending vertically a first distance; a first dummy gate electrode extending vertically a second distance, the first dummy gate electrode being in parallel with the active gate electrode; a first cut region extending horizontally across the active gate electrode and the first dummy gate electrode; a second cut region spaced vertically from the first cut region and extending horizontally across the active gate electrode and the first dummy gate electrode; an active region between the first cut region and the second cut region; a dummy gate pass-active region between the first cut region and the active region along the first dummy gate electrode; and an active gate pass-active region between the first cut region and the active region along the active gate electrode.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which:

FIGS. 1A-D illustrate exemplary fin-FET configurations in accordance with some examples of the disclosure.

FIGS. 3A and 3B illustrate and exemplary circuit diagram and physical layout of a NAND integrated logic circuit in accordance with some examples of the disclosure.

Figures 2A, 2B:
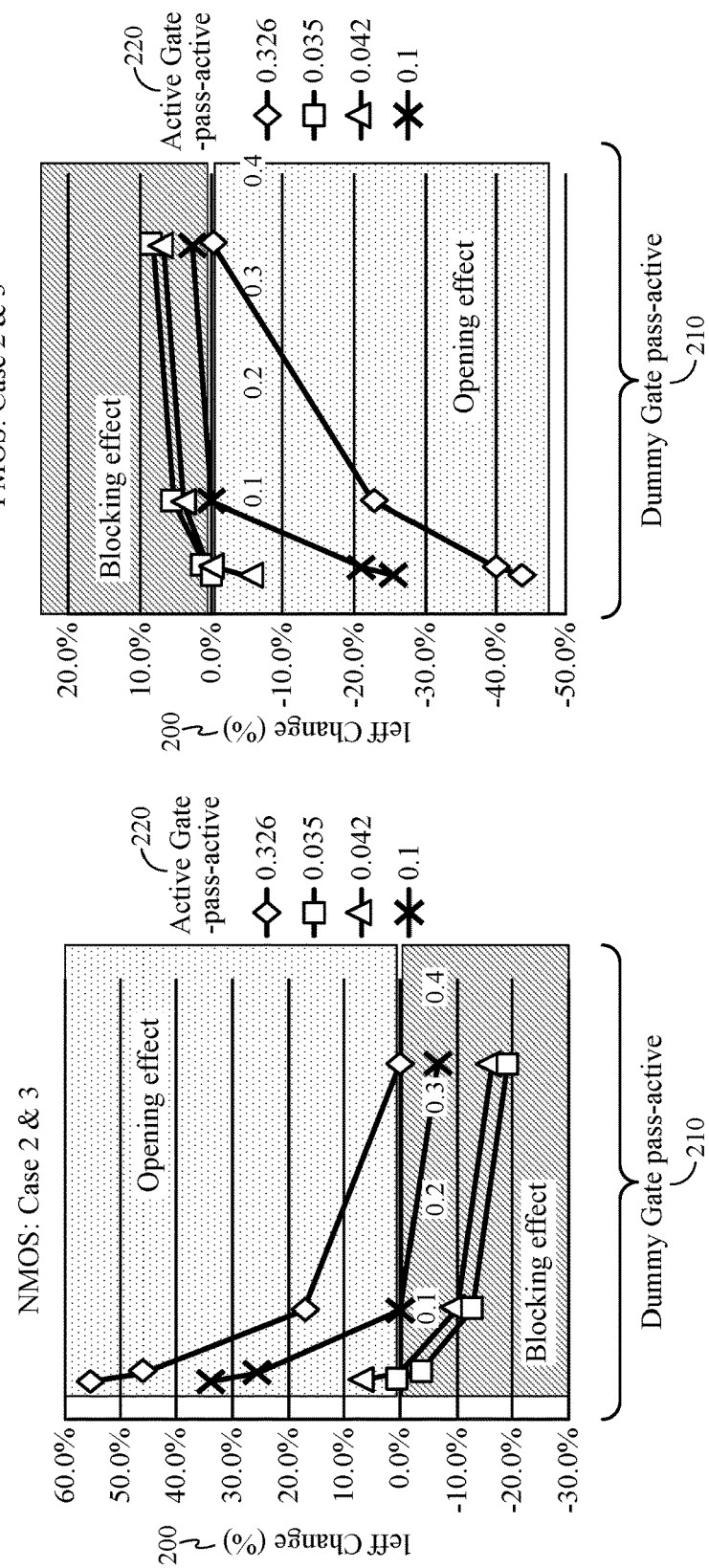
FIGS. 2A and B illustrate exemplary graphs of a transistor effective current change for certain fin-FET configurations in accordance with some examples of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The exemplary methods, apparatus, and systems disclosed herein advantageously address the long-felt industry needs, as well as other previously unidentified needs, and mitigate shortcomings of the conventional methods, apparatus, and systems.

The word "exemplary" is used herein to mean "serving as an example, instance, or illustration." Any details described herein as "exemplary" is not necessarily to be construed as preferred or advantageous over other examples. Likewise, the term "examples" does not require that all examples include the discussed feature, advantage or mode of operation. Use of the terms "in one example," "an example," "in one feature," and/or "a feature" in this specification does not necessarily refer to the same feature and/or example. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples only and is not intended to be limiting of examples of the disclosure. As used herein, the singular forms "a," "an," and "the" are intended to include the plural forms as well, unless the context clearly indicates otherwise. It will be further understood that the terms "comprises", "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element. Coupling and/or connection between the elements can be physical, logical, or a combination thereof. As employed herein, elements can be "connected" or "coupled" together, for example, by using one or more wires, cables, and/or printed electrical connections, as well as by using electromagnetic energy. The electromagnetic energy can have wavelengths in the radio frequency region, the microwave region and/or the optical (both visible and invisible) region. These are several non-limiting and non-exhaustive examples.

Any reference herein to an element using a designation such as "first," "second," and so forth does not limit the quantity and/or order of those elements. Rather, these designations are used as a convenient method of distinguishing between two or more elements and/or instances of an element. Thus, a reference to first and second elements does not mean that only two elements can be employed, or that the first element must necessarily precede the second element. Also, unless stated otherwise, a set of elements can comprise one or more elements. In addition, terminology of the form "at least one of: A, B, or C" used in the description or the claims can be interpreted as "A or B or C or any combination of these elements."

FIGS. 1A-D illustrate exemplary fin-FET configurations (cases 1-4 respectively) in accordance with some examples of the disclosure. As shown in FIG. 1A, an fin-FET 100 may include an active gate electrode 110 that extends vertically a first distance 120, a first dummy gate electrode 130 that extends vertically a second distance 140 in parallel with the active gate electrode 110, a first cut region 150 extending horizontally across the active gate electrode 110 and the first dummy gate electrode 130, and a second cut region 160 spaced vertically from the first cut region 150 and extending horizontally across the active gate electrode 110 and the first dummy gate electrode 130. The first cut region 150 defines an active gate pass-active region 170 between the first cut region 150 and an active region 190 along the active gate electrode 110 and a dummy gate pass-active region 171 between the first cut region 150 and the active region 190 along the first dummy gate electrode 130, respectively. The active gate pass-active region 170 will result in an electrical effect in the effective transistor channel current for the active gate electrode 110 that will be more fully described later. As shown in FIG. 1A, the fin-FET 100 may also include more than the first dummy gate electrode 130, such as a second dummy gate electrode 131, a third dummy gate electrode 132, and a fourth dummy gate electrode 133. The fin-FET 100 may also include one or more source-drain electrodes extending horizontally, such as a first source-drain electrode 180, a second source-drain electrode 181, a third source-drain electrode 182, and a fourth source-drain electrode 183. Each of the first source-drain electrode 180, second source-drain electrode 181, third source-drain electrode 182, and fourth source-drain electrode 183 may be configured as a source electrode or a drain electrode based on whether a p-type or n-type fin-FET is desired. The fin-FET 100 may also include the active region 190 extending horizontally and vertically within the central region of the fin-FET 100. As shown in FIG. 1A, when the first cut region 150 and the second cut region 160 extend uniformly across the active gate electrode 110, first dummy electrode 130, second dummy gate electrode 131, third dummy gate electrode 132, and fourth dummy gate electrode 133, the active gate pass-active region 170 is the same as the dummy gate pass-active region 171. When the active gate pass-active region 170 and the dummy gate pass-active region 171 are uniform, there is little to no increased electrical effect on the effective transistor channel current (case 1).

However, by having a non-uniform active gate pass-active region 170 and dummy gate pass-active region 171, the effective transistor channel current is impacted. FIGS. 1B-1D depict various configurations (cases 2-4 respectively) to illustrate this aspect. As shown in FIG. 1B, an fin-FET 100 may include an active gate electrode 110 that extends vertically a first distance 120, a first dummy gate electrode 130 that extends vertically a second distance 140 in parallel with the active gate electrode 110, a first cut region 150 extending horizontally across the active gate electrode 110 and a second cut region 160 spaced vertically from the first cut region 150 and extending horizontally across the active gate electrode 110. The first cut region 150 defines the active gate pass-active region 170 between the first cut region 150 and the active region 190 along the active gate electrode 110 while a dummy gate pass-active region 171 for the first dummy gate electrode 130 remains the same. Since the active gate pass-active region 170 of the active gate electrode 110 is different than the dummy gate pass-active region 171 of the first dummy gate electrode 130, a different effective transistor channel current for the active gate electrode 110 is achieved. When the active gate pass-active region 170 of the active gate electrode 110 is shorter than the dummy gate pass-active region 171 of the first dummy gate electrode 130, this is called a blocking configuration (case 2).

As shown in FIG. 1C, an fin-FET 100 may include an active gate electrode 110 that extends vertically a first distance 120, a first dummy gate electrode 130 that extends vertically a second distance 140 in parallel with the active gate electrode 110, a first cut region 150 extending horizontally across the first dummy gate electrode 130 and a second cut region 160 spaced vertically from the first cut region 150 and extending horizontally across the first dummy gate electrode 130. The first cut region 150 defines the dummy gate pass-active region 171 between the first cut region 150 and the active region 190 along the first dummy gate electrode 130 while the active gate pass-active region 170 for the active gate electrode 110 remains the same. Since the active gate pass-active region 170 of the active gate electrode 110 is different than the dummy gate pass-active region 171 of the first dummy gate electrode 130, a different effective transistor channel current for the active gate electrode 110 is achieved. When the active gate pass-active region 170 of the active gate electrode 110 is longer than the dummy gate pass-active region 171 of the first dummy gate electrode 130, this is called an open configuration (case 3).

As shown in FIG. 1D, an fin-FET 100 may include an active gate electrode 110 that extends vertically a first distance 120, a first dummy gate electrode 130 that extends vertically a second distance 140 in parallel with the active gate electrode 110, a fourth dummy gate electrode 133 that extends vertically the second distance 140 in parallel with the active gate electrode 110, a first cut region 150 extending horizontally across the first dummy gate electrode 130 and a second cut region 160 spaced vertically from the first cut region 150 and extending horizontally across the first dummy gate electrode 130. The first cut region 150 defines the dummy gate pass-active region 171 between the first cut region 150 and the active region 190 along the first dummy gate electrode 130 while an active gate pass-active region 170 for the active gate electrode 110 remains the same and a second dummy gate pass-active region 172 for the fourth dummy gate electrode 133 remains the same. Since the active gate pass-active region 170 of the active gate electrode 110 is different than the dummy gate pass-active region 171 of the first dummy gate electrode 130 and the same as the second dummy gate pass-active region 172 of the fourth dummy gate electrode 133, a different effective transistor channel current for the active gate electrode 110 is achieved. When the active gate pass-active region 170 of the active gate electrode 110 is longer than the dummy gate pass-active region 171 of the first dummy gate electrode 130 but the same as the second dummy gate pass-active region 172 of the fourth dummy gate electrode 133, this is called a partially open configuration (case 4).

FIGS. 2A and B illustrate exemplary graphs of a transistor channel current change for certain fin-FET configurations (cases 2 and 3 from FIGS. 1B and 1C, respectively) in accordance with some examples of the disclosure. FIG. 2A shows the percentage of effective transistor channel current change (Ieff) 200 versus the dummy gate pass-active region 210 of the first dummy gate electrode 130 in μm to the active gate pass-active region 220 of the active gate electrode 110 in μm as indicated. The Ieff 200 is shown in FIG. 2A for a fin-FET 100 that is configured as a n-type for case 2 (blocking effect) and case 3 (opening effect). For example, when the active gate pass-active region 220 is 0.326 μm and the dummy gate pass-active region 210 is 0.326 μm as well, there is a 0% change in Ieff 200.

FIG. 2B shows the percentage of effective transistor channel current change (Ieff) 200 versus the dummy gate pass-active region 210 of the first dummy gate electrode 130 to the active gate pass-active region 220 of the active gate electrode 110 as indicated. The Ieff 200 is shown in FIG. 2B for a fin-FET 100 that is configured as a p-type for case 2 (blocking effect) and case 3 (opening effect). For example, when the active gate pass-active region 220 is 0.326 μm and the dummy gate pass-active region 210 is 0.042 μm, there is a −40% change in Ieff 200. Thus, the N/P strength ratio of a fin-FET based integrated logic circuit may be tuned as desired by the location and arrangement of the cut regions in the gate electrodes that results in a different effective transistor channel current for each fin-FET in the logic circuit. FIGS. 3A, 3B, 4A, and 4B illustrate various types of fin-FET integrated logic circuits that utilize the different cut region arrangements described above to achieve the desired circuit type.

FIGS. 3A and 3B illustrate and exemplary circuit diagram and physical layout of a NAND integrated logic circuit in accordance with some examples of the disclosure. As shown in FIG. 3A, a NAND integrated logic circuit 300 may include a first input (A) 301, a second input (B) 302, an output (AnandB) 303, a first PMOS fin-FET 304 in parallel with a second PMOS fin-FET 305, and a first NMOS fin-FET 306 in series with a second NMOS fin-FET 307. In a NAND integrated logic circuit 300, the first NMOS fin-FET 306 and the second NMOS fin-FET 307 need to be stronger than the first PMOS fin-FET 304 and the second PMOS fin-FET 305 due to the nested NMOS chain (the first NMOS fin-FET 306 and the second NMOS fin-FET 307 are in series).

FIG. 3B depicts a physical layout for the NAND integrated logic circuit 300. As shown in FIG. 3B, a NAND integrated logic circuit 300 may include a first input (IN1) 301, a second input (IN2) 302, an output (OUT) 303, a first p-type fin-FET 304 in parallel with a second p-type fin-FET 305, and a first n-type fin-FET 306 in series with a second n-type fin-FET 307. The NAND integrated logic circuit 300 may have a first active cut region 350P extending horizontally across the first p-type fin-FET 304 and the second p-type fin-FET 305, a first dummy cut region 351P extending horizontally across part of the NAND integrated logic circuit 300, a second active cut region 350N extending horizontally across the first n-type fin-FET 306 and the second n-type fin-FET 307, and a second dummy cut region 351N extending horizontally across part of the NAND integrated logic circuit 300. The second active cut region 350N defines an active gate pass-active region 370N and the second dummy cut region 351N defines a dummy gate pass-active region 371N.

Figure 4A:
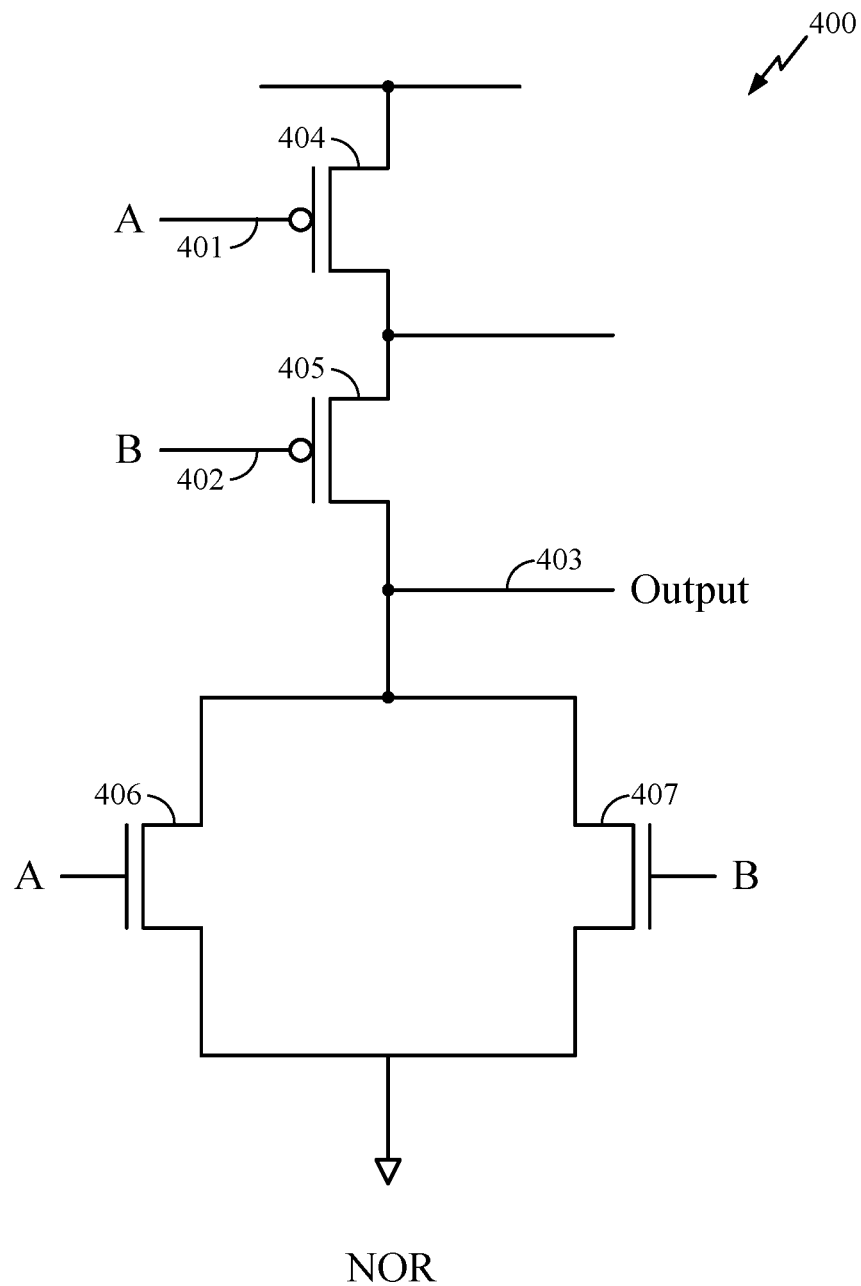
FIGS. 4A and 4B illustrate and exemplary circuit diagram and physical layout of a NOR integrated logic circuit in accordance with some examples of the disclosure.
Figure 4B:
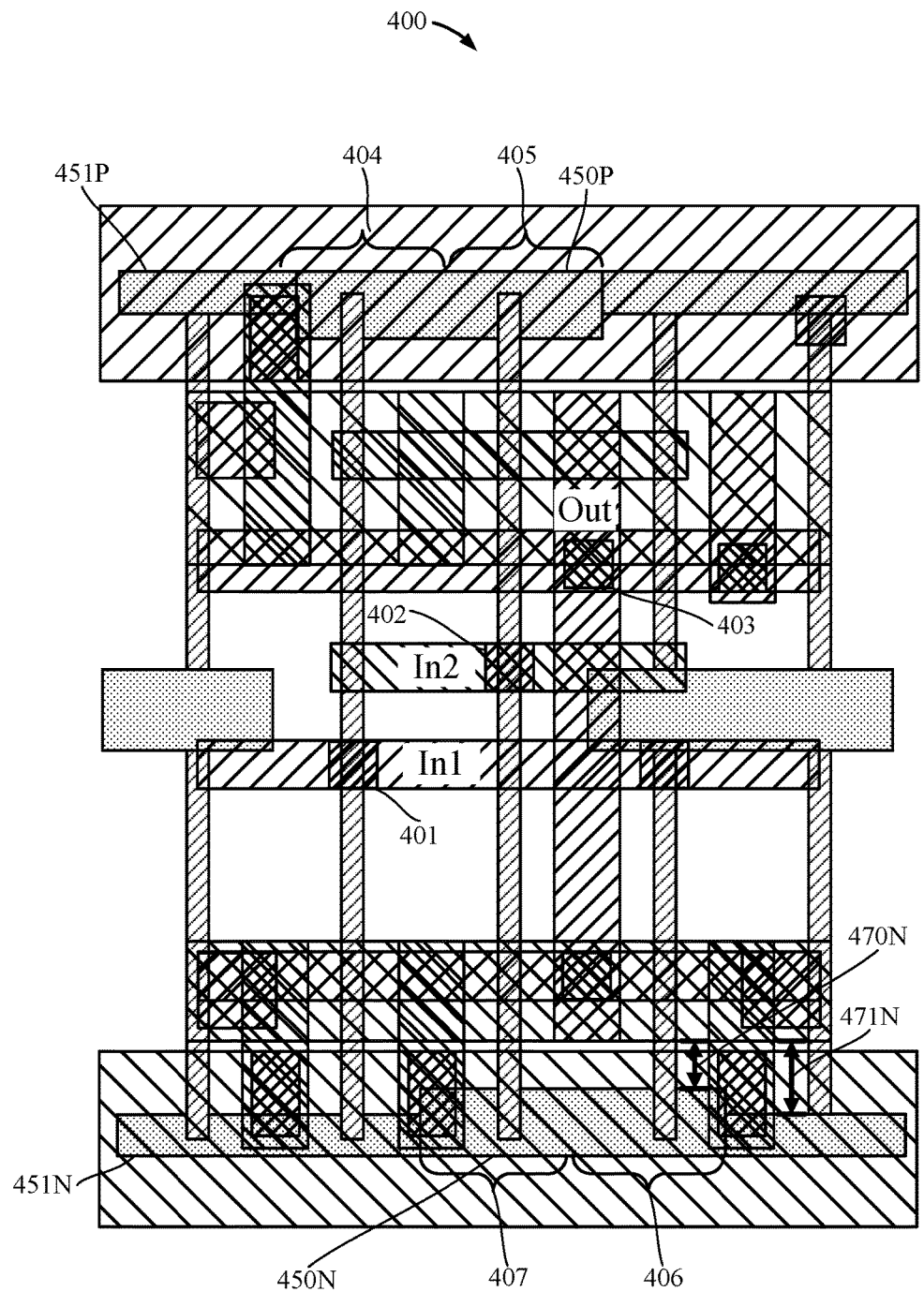

FIGS. 4A and 4B illustrate and exemplary circuit diagram and physical layout of a NOR integrated logic circuit in accordance with some examples of the disclosure. As shown in FIG. 4A, a NOR integrated logic circuit 400 may include a first input (A) 401, a second input (B) 402, an output 403, a first PMOS fin-FET 404 in series with a second PMOS fin-FET 405, and a first NMOS fin-FET 406 in parallel with a second NMOS fin-FET 407. In the NOR integrated logic circuit 400, the first NMOS fin-FET 406 and the second NMOS fin-FET 407 need to be weaker than the first PMOS fin-FET 404 and the second PMOS fin-FET 405 due to the nested PMOS chain (the first PMOS fin-FET 404 and the second PMOS fin-FET 405 are in series).

FIG. 4B depicts a physical layout for the NOR integrated logic circuit 400. As shown in FIG. 4B, a NOR integrated logic circuit 400 may include a first input (IN1) 401, a second input (IN2) 402, an output (OUT) 403, a first p-type fin-FET 404 in parallel with a second p-type fin-FET 405, and a first n-type fin-FET 406 in series with a second n-type fin-FET 407. The NOR integrated logic circuit 400 may have a first active cut region 450P extending horizontally across the first p-type fin-FET 404 and the second p-type fin-FET 405, a first dummy cut region 451P extending horizontally across part of the NOR integrated logic circuit 400, a second active cut region 450N extending horizontally across the first n-type fin-FET 406 and the second n-type fin-FET 407, and a second dummy cut region 451N extending horizontally across part of the NOR integrated logic circuit 400. The second active cut region 450N defines an active gate pass-active region 470N and the second dummy cut region 451N defines a dummy gate pass-active region 471N.

Nothing stated or illustrated depicted in this application is intended to dedicate any component, step, feature, benefit, advantage, or equivalent to the public, regardless of whether the component, step, feature, benefit, advantage, or the equivalent is recited in the claims.

Although some aspects have been described in connection with a device, it goes without saying that these aspects also constitute a description of the corresponding method, and so a block or a component of a device should also be understood as a corresponding method step or as a feature of a method step. Analogously thereto, aspects described in connection with or as a method step also constitute a description of a corresponding block or detail or feature of a corresponding device. Some or all of the method steps can be performed by a hardware apparatus (or using a hardware apparatus), such as, for example, a microprocessor, a programmable computer or an electronic circuit. In some examples, some or a plurality of the most important method steps can be performed by such an apparatus.

In the detailed description above it can be seen that different features are grouped together in examples. This manner of disclosure should not be understood as an intention that the claimed examples require more features than are explicitly mentioned in the respective claim. Rather, the situation is such that inventive content may reside in fewer than all features of an individual example disclosed. Therefore, the following claims should hereby be deemed to be incorporated in the description, wherein each claim by itself can stand as a separate example. Although each claim by itself can stand as a separate example, it should be noted that-although a dependent claim can refer in the claims to a specific combination with one or a plurality of claims-other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods disclosed in the description or in the claims can be implemented by a device comprising means for performing the respective steps or actions of this method.

Furthermore, in some examples, an individual step/action can be subdivided into a plurality of sub-steps or contain a plurality of sub-steps. Such sub-steps can be contained in the disclosure of the individual step and be part of the disclosure of the individual step.

While the foregoing disclosure shows illustrative examples of the disclosure, it should be noted that various changes and modifications could be made herein without departing from the scope of the disclosure as defined by the appended claims. The functions, steps and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A fin-FET comprising:
    an active gate electrode extending vertically a first distance, the active gate electrode configured to have a first input of a ground potential or a positive voltage potential;
    a first dummy gate electrode extending vertically a second distance, the first dummy gate electrode being in parallel with the active gate electrode and configured to have a second input of the ground potential or the positive voltage potential opposite the first input;
    a first cut region extending horizontally across the first dummy gate electrode;
    a second cut region spaced vertically from the first cut region and extending horizontally across the first dummy gate electrode;
    an active region between the first cut region and the second cut region;

a dummy gate pass-active region between the first cut region and the active region along the first dummy gate electrode; and an active gate pass-active region between an end of the active gate electrode and the active region along the active gate electrode.

2. The fin-FET of claim 1, wherein the active gate pass-active region is one of approximately 0.326 μm, 0.1 μm, 0.042 μm, or 0.035 μm.

3. The fin-FET of claim 2, wherein the dummy gate pass-active region is shorter than the active gate pass-active region and is one of approximately 0.326 μm, 0.1 μm, 0.042 μm, or 0.035 μm.

4. The fin-FET of claim 1, further comprising a second dummy gate electrode extending in parallel with the first dummy gate electrode and spaced horizontally therefrom, the second dummy gate electrode configured to have a third input the same as the second input, wherein the first cut region includes a first portion extending across the second dummy gate electrode and a second portion extending across the first dummy gate electrode, a second dummy gate pass-active region being between the first portion of the first cut region and the active region.

5. The fin-FET of claim 4, wherein the first portion of the first cut region has a width smaller than a width of the second portion of the first cut region.

6. The fin-FET of claim 4, wherein the first portion of the first cut region has a width larger than a width of the second portion of the first cut region.

7. The fin-FET of claim 4, wherein the second cut region includes a first portion extending across the second dummy gate electrode and a second portion extending across the first dummy gate electrode.

8. The fin-FET of claim 7, further comprising a third dummy gate electrode extending in parallel with the first dummy gate electrode and spaced horizontally therefrom, the third dummy gate electrode configured to have a fourth input; the second portion of the first cut region extending horizontally across the third dummy gate electrode; and the second portion of the second cut region extending horizontally across the third dummy gate electrode.

9. The fin-FET of claim 8, further comprising a fourth dummy gate electrode extending in parallel with the third dummy gate electrode and spaced horizontally therefrom opposite the active gate electrode, the fourth dummy gate electrode configured to have a fifth input; the first portion of the first cut region extending horizontally across the fourth dummy gate electrode; and the first portion of the second cut region extending horizontally across the fourth dummy gate electrode.

10. The fin-FET of claim 7, wherein the first portion of the second cut region has a width smaller than a width of the second portion of the second cut region.

11. The fin-FET of claim 7, wherein the first portion of the second cut region has a width larger than a width of the second portion of the second cut region.

12. The fin-FET of claim 8, wherein the second portion of the first cut region extends continuously between the first dummy gate electrode and the third dummy gate electrode, the second portion of the second cut region extends continuously between the first dummy gate electrode and the third dummy gate electrode.

13. The fin-FET of claim 1, wherein the fin-FET is incorporated into a device selected from the group consisting of a set top box, a music player, a video player, an entertainment unit, a navigation device, a communications device, a personal digital assistant (PDA), a fixed location data unit, and a computer.

14. A fin-FET comprising:

an active gate electrode extending vertically a first distance, the active gate electrode configured to have a first input of a ground potential or a positive voltage potential;

a first dummy gate electrode extending vertically a second distance, the first dummy gate electrode being in parallel with the active gate electrode and configured to have a second input of the ground potential or the positive voltage potential opposite the first input;

a second dummy gate electrode extending in parallel with the first dummy gate electrode and spaced horizontally therefrom, the second dummy gate electrode configured to have a third input the same as the second input;

a first cut region extending horizontally across the first dummy gate electrode and the second dummy gate electrode;

a second cut region spaced vertically from the first cut region and extending horizontally across the first dummy gate electrode and the second dummy gate electrode;

an active region between the first cut region and the second cut region;

a first dummy gate pass-active region between the first cut region and the active region along the first dummy gate electrode;

a second dummy gate pass-active region between the first cut region and the active region along the second dummy gate electrode; and an active gate pass-active region between an end of the active gate electrode and the active region along the active gate electrode.

15. The fin-FET of claim 14, wherein the active gate pass-active region is one of approximately 0.326 μm, 0.1 μm, 0.042 μm, or 0.035 μm.

16. The fin-FET of claim 15, wherein the first dummy gate pass-active region is shorter than the active gate pass-active region and is one of approximately 0.326 μm, 0.1 μm, 0.042 μm, or 0.035 μm.

17. The fin-FET of claim 16, wherein the second dummy gate pass-active region is shorter than the active gate pass-active region and is one of approximately 0.326 μm, 0.1 μm, 0.042 μm, or 0.035 μm.

18. The fin-FET of claim 14, wherein the first cut region includes a first portion extending across the second dummy gate electrode and a second portion extending across the first dummy gate electrode, the second dummy gate pass-active region being between the first portion of the first cut region and the active region, the first portion of the first cut region has a width smaller than a width of the second portion of the first cut region.

19. The fin-FET of claim 14, wherein the first cut region includes a first portion extending across the second dummy gate electrode and a second portion extending across the first dummy gate electrode, the second dummy gate pass-active region being between the first portion of the first cut region and the active region, the first portion of the first cut region has a width larger than a width of the second portion of the first cut region.

20. The fin-FET of claim 14, wherein the fin-FET is incorporated into a device selected from the group consisting of a set top box, a music player, a video player, an entertainment unit, a navigation device, a communications device, a personal digital assistant (PDA), a fixed location data unit, and a computer.

\* \* \* \* \*